(12) United States Patent
Gao et al.

(10) Patent No.: US 6,649,318 B1
(45) Date of Patent: Nov. 18, 2003

(54) SELF-CONTAINED IMAGING MEDIA COMPRISING MICROENCAPSULATED COLOR FORMERS AND A RESILIENT LAYER

(75) Inventors: Justin Z. Gao, Rochester, NY (US); Yongcai Wang, Webster, NY (US); Charles C. Anderson, Penfield, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 09/552,916

(22) Filed: Apr. 20, 2000

(51) Int. Cl.$^7$ .............................. G03C 1/73; G03C 1/76
(52) U.S. Cl. ...................... 430/138; 430/207; 430/211; 430/496
(58) Field of Search .................. 430/138, 207, 430/211, 496, 259

(56) References Cited

U.S. PATENT DOCUMENTS

| | | | |
|---|---|---|---|
| 4,399,209 A | 8/1983 | Sanders et al. | |
| 4,416,966 A | 11/1983 | Sanders et al. | |
| 4,440,846 A | 4/1984 | Sanders et al. | |
| 4,648,699 A | 3/1987 | Holycross et al. | |
| 4,740,809 A | 4/1988 | Yamamoto et al. | |
| 4,766,050 A | 8/1988 | Jerry | |
| 4,858,078 A | * 8/1989 | Morimoto et al. | 361/527 |
| 4,977,060 A | * 12/1990 | Liang et al. | 430/138 |
| 4,992,822 A | 2/1991 | Yamamoto et al. | |
| 5,043,314 A | * 8/1991 | Suzuki et al. | 503/214 |
| 5,066,572 A | 11/1991 | O'Connor et al. | |
| 5,112,540 A | * 5/1992 | Chen et al. | 264/4.7 |
| 5,296,331 A | * 3/1994 | Taguchi | 430/253 |
| 5,300,639 A | 4/1994 | Aono et al. | |
| 5,395,239 A | * 3/1995 | Komatsu et al. | 433/68 |
| 5,418,120 A | 5/1995 | Bauer et al. | |
| 5,783,353 A | 7/1998 | Camillus et al. | |
| 5,893,662 A | 4/1999 | Ito | |
| 5,916,727 A | 6/1999 | Camillus et al. | |
| 5,996,793 A | 12/1999 | Uchibori et al. | |
| 6,030,740 A | * 2/2000 | Polykarpov | 430/138 |
| 6,037,094 A | * 3/2000 | Katampe et al. | 430/138 |
| 6,080,520 A | * 6/2000 | Polykarpov et al. | 430/138 |
| 6,127,084 A | * 10/2000 | Katampe et al. | 430/138 |
| 6,187,522 B1 | * 2/2001 | Majumdar et al. | 430/527 |
| 6,326,120 B1 | * 12/2001 | Wang et al. | 430/138 |
| 6,365,319 B1 | * 4/2002 | Heath et al. | 430/138 |
| 6,443,202 B1 | * 9/2002 | Burton et al. | 152/524 |
| 6,495,223 B1 | * 12/2002 | Berlin | 428/34.2 |

FOREIGN PATENT DOCUMENTS

EP   0 980 026 A1   2/2000

OTHER PUBLICATIONS

Database WPI Section Ch, Week 199836, Derwent Publications Ltd., London, GB; AN 1998–418106 XP002175017.
WO 95/34845 A, (The Mead Corporation), Dec. 21, 1995, p. 8, paragraph 3, figures 1–7.
Patent Abstracts of Japan, vol. 016, No. 477, (M–1320), Oct. 5, 1992, & JP 04 173389 A (Fuji Photo Film Co. Ltd.), Jun. 22, 1992 abstract.

* cited by examiner

Primary Examiner—Janet Baxter
Assistant Examiner—Yvette C. Thornton
(74) Attorney, Agent, or Firm—Chris P. Konkol

(57) ABSTRACT

A self-contained photohardenable imaging assembly comprising in order: a first transparent support; an imaging layer comprising a developer material and a plurality of photohardenable microcapsules encapsulating a color precursor, and a second support, wherein an intermediate resilient layer is place beneath at least one support and above said imaging layer, which intermediate resilient layer has a thickness of 10 to 50 microns and comprises a relatively resilient material compared to the one support. The imaging assembly has been found to provide better image quality and more consistence sensitometric response to pressure development.

22 Claims, 4 Drawing Sheets

SELF-CONTAINED IMAGING MEDIA COMPRISING MICROENCAPSULATED COLOR FORMERS AND A RESILIENT LAYER

FIELD OF THE INVENTION

The present invention relates to an imaging assembly which comprises at least one imaging layer comprising photohardenable microencapsulated coloring agents. Development is accomplished by the application of uniform pressure to the imaging assembly. Improved performance is obtained with respect to the imaging assembly's response to pressure by employing an intermediate resilient layer over the imaging layer.

BACKGROUND OF THE INVENTION

The present invention relates to an imaging medium in the form of a self-contained imaging assembly and, more particularly, to an improved self-contained imaging assembly containing a photosensitive imaging layer or layers comprising photohardenable microcapsules encapsulating a coloring material and, outside the microcapsules, a developer material disposed between a first transparent support and a second support which may be opaque or transparent. The imaging medium or assembly can also be referred to as a recording medium, and the imaging layer can be referred to as a recording layer, since the assembly can serve both to capture an image (either the original image or an electronic copy), as does film, and also to display the image, as does a print. Consistent with this fact, the imaging assembly can form a positive image.

The photosensitive imaging layer (including microcapsules) is colored by pressure development after exposure to radiation based on image information. The microcapsules, whose mechanical strength changes (increases) when exposed to light, are ruptured by means of pressure development, whereupon the coloring material and other substances encapsulated in the microcapsules flow out (to varying amounts based on the exposure) and development occurs. The coloring material, such as a substantially colorless color former, migrates to, and reacts with, the developer material and coloring occurs, whereupon a color image is developed.

The "rupture" of the microcapsules are not an all-or-nothing event. Rather, the microcapsules exposed to light are differentially photocured to release varying amounts of color former in order to achieve tonal depth in the exposed area. The differential exposure to light proportionately increases the viscosity of the photocurable composition and thus immobilizes the color former proportionately to the desired tonal depth in the exposed area. The rupture of the microcapsules and the release of the color former is accomplished by the uniform application of pressure. Development of the photosensitive imaging layer can be accomplished, for example, by passing the imaging assembly between a pair of upper and lower nip rollers.

Photohardenable imaging systems employing microencapsulated photosensitive compositions are the subject of various patents, including U.S. Pat. Nos. 4,399,209, 4,416,966, 4,440,846, 4,766,050, 5,783,353, and 5,916,727. Image forming devices (also referred to as printers) are disclosed, for example, in U.S. Pat. No. 4,740,809, wherein exposure occurs by guiding a light from a light source for a plurality of colors across a photosensitive recording medium. U.S. Pat. No. 4,992,822 discloses an image forming device, capable of producing a plurality of colors via a polygonal mirror, for repeatedly exposing the same pixels in a photosensitive recording medium. U.S. Pat. No. 5,893,662 discloses a device for printing an image wherein the device can be incorporated into a computer bay. U.S. Pat. No. 4,648,699 describes a development technique which employs, instead of a pair of nip rollers, a point contact ball moving relative to the photosensitive recording medium.

In the most typical embodiments, the photohardenable composition is a photopolymerizable composition including a polyethylenically unsaturated compound and a photoinitiator and is encapsulated together with a color former. Exposure to actinic radiation hardens the internal phase of the microcapsules. Then, as mentioned above, following exposure, the imaging media in the form of a sheet can be subjected to a uniform rupturing force by passing the sheet through the nip between a pair of pressure rollers.

One of the problems in providing a self-contained imaging assembly that provides a high quality print is image stability or "keeping" which is affected by humidity sensitivity. It is known that print quality, and in particular sensitometric response to actinic radiation, can be significantly affected by sensitivity to humidity and the relative humidity of the environment. Even if the media is manufactured and packaged at a particular humidity, which is found optimum for print quality, variations after the media acclimates to a different later environment can adversely affect the sensitometric properties. This has been attributed to the materials employed in the imaging media, in particular the degree of hardening or curing of the internal phase of a microcapsule and the consequent change in the viscosity with the change in humidity. As a result thereof, photographic characteristics such as speed, maximum density and fogging density are changed from the original optimum. Furthermore, a full color imaging is adversely affected.

In forming a full color image, color precursors which develop into yellow, magenta and cyan colors and photoinitiators corresponding to blue, green and red lights are encapsulated in an internal phase of the microcapsules, and the three sets of the microcapsules are mixed to prepare a full color imaging material containing a developer. The photographic characteristics of the respective microcapsules vary with the change in humidity to different degrees, which may result in muddy colors or incorrect or suboptimal colors. For example, when it is desired that a yellow color be developed, cyan and magenta capsules are cured by red and green lights, and only a yellow color former comes out of the ruptured capsules to react with a color-developer to form an image. However, if the cyan or magenta capsules insufficiently cure due to the change in humidity, the result may be a muddy color in which cyan or magenta is blended with yellow to some extent. Such muddy colors or other sensitometric phenomena due to a change in humidity has been a significant problem.

One technique that has been used to address the humidity problem and to improve media stability resides is conditioning the layer containing the developer and microcapsules to a relative humidity (RH) of about 10 to 40% and preferably about 20%. For example, U.S. Pat. Nos. 5,916,727 and 5,783,353 disclose conditioning the layer at about 20% RH for about 2 to 12 hours or more, at ambient temperatures, and subsequently sealing the assembly at this low RH level to assure that the layer is relatively moisture-free during the normal shelf-life of the assembly.

U.S. Pat. No. 5,996,793 discloses storing the image-forming material together with a humidity-controlling material. Further, the patent discloses storing the image-forming material and the humidity-controlling material within a package made from a low-moisture permeable film. The low-moisture permeable film can be a plastic film on which is deposited a metal. Other low-moisture permeable films mentioned include fluorinated resins such as polytetrachloroethylene, polytrifluoroethylene, chlorinated rubber, polyvinylidene chloride, a copolymer of polyvinylidene chloride and acrylonitrile, polyethylene, polypropylene, polyesters, and films obtained by depositing a metal such as aluminum and a metal oxide such as silicon oxide.

Unfortunately, when an open package of the imaging media is not used right away, especially if a plurality of media are stored for some time in a printing device prior to forming an image, the media may have an opportunity to adjust to ambient humidity and, especially in very dry or very humid climates, the RH of the media may decrease or increase substantially in a short time. Once the imaging media is removed from a package, it does not take very long for the environmental humidity to affect the media. Ambient humidity can soon penetrate the outside surface support on each side of the media causing a change in the moisture content within the media.

Resilient materials have been used in the photographic arts for various reasons. For example, U.S. Pat. No. 5,066,572 to O'Connor discloses the control of pressure fog in a photographic film with soft polymer latex particles. Mechanical pressure applied to photographic emulsion coatings can produce irreversible effects on the sensitometry of the product, which increases with the magnitude of the applied pressure. The patent discloses a substantially less pressure sensitive photographic film comprising a support, at least one light sensitive silver halide element and an overlaying element comprising gelatin-grafted or case hardened gelatin-grafted soft polymer particle composite element. The incorporation of such an overlaying composite particle cushioning layer is described as particularly suitable for highly pressure sensitive tabular grain emulsions.

U.S. Pat. No. 5,300,639 to Lushington et al. discloses a photographic element containing a stress absorbing intermediate resilient layer. The patent discloses a light sensitive photographic element having a support bearing at least one light sensitive silver halide emulsion layer and at least one non-light sensitive stress absorbing layer between the emulsion layer and the support, wherein the stress absorbing layer comprises a polymer and a hydrophilic colloid. This has been found to reduce pressure fog while maintaining scratch resistance.

U.S. Pat. No. 5,418,120 to Bauer et al. discloses a thermally processable imaging element in which the image is formed by imagewise heating or by imagewise exposure to light followed by uniform heating include an adhesive interlayer interposed between the imaging layer and a protective overcoat layer. The adhesive interlayer, which is comprised of a polyalkoxysilane, strongly bonds the overcoat layer to the imaging layer.

The above-cited prior-art references describe the use of an interlayer or a protective layer to decrease the pressure on, and pressure-sensitization of, photographic elements. However, for imaging media colored by pressure development, a certain pressure level needs to be maintained to fracture the microcapsules during the image development. In summary, the prior art references relate to some aspects of the present invention, but do not address the humidity sensitivity of the image assembly, nor do they disclose or suggest an adequate solution to this problem. Therefore, there is a need for an imaging assembly having an intermediate resilient layer that significantly reduces the humidity effect on image quality by reducing the pressure sensitivity to humidity in the imaging layer.

After extensive investigations, Applicants have found that humidity affects the mechanical properties of the imaging layers, as compared to the reaction properties of materials during photohardening of the imaging layer. The affect on mechanical properties cause undesirable variations in the degree of rupture of the microcapsules when the media is subjected to pressure during development. Although not wishing to be bound by theory, this may be due to the humidity changing the break strength of the capsules and/or it may be due to the change in the stiffness of the imaging layer which in turn alters the pressure applied to the microcapsules, more likely the latter.

An object of the present invention is, therefore, to provide a self-contained photohardenable imaging assembly that is resistant to the effect of humidity and which will print consistently in response to a means for applying pressure to the assembly.

It would be desirable to obtain an improved media that has no significant change in sensitometric properties with relative humidity, based on speed, Dmax, Dmin, tonal scale, and full color correctness.

It would also be desirable to obtain an improved media that has improved Raw Stock Keeping (RSK), from manufacture to use.

It would be particularly desirable if these objectives could be accomplished without requiring radical changes in conventional imaging chemistry, with respect to the microcapsules and the developer. It would be advantageous if these objectives could be attained in a product that was economical to manufacture and inexpensive for the customer to purchase.

SUMMARY OF THE INVENTION

In the self-contained imaging system of the present invention, an imaging layer containing developer and the photohardenable microcapsules are placed, preferably sealed, between first (front) and second (back) support members to form an integral unit, with an intermediate resilient layer between at least one support and said imaging layer, which intermediate resilient layer has a thickness of 10 to 50 microns and comprises a relatively resilient material compared to the overlying support. Suitably, the Young's modulus of the first support is at least 690 MPa (100 kilopounds per square inch or kpsi), and the Young's modulus of said intermediate resilient layer is less than 6.9 MPa (10 kpsi). In one embodiment of the invention the Young's modulus of the intermediate resilient layer is 1% to 200% of the Young's modulus of the imaging layer at 80% relative humidity. In the case of the intermediate resilient layer is under a transparent support, the support and intermediate resilient layer in combination should have light transmission of at least about 80% at a wavelength at 550 nm.

In the imaging assembly of the invention, a first support is transparent and a second support may be transparent or opaque. In the latter case, an image is provided against a substantially white background as viewed through the transparent support and, in the former case, the image is viewed as a transparency preferably using an overhead or slide projector. Sometimes herein the first support may be referred to as the "front" support and the second support may be referred to as the "back" support.

DETAILED DESCRIPTION OF THE INVENTION

Figure 1:
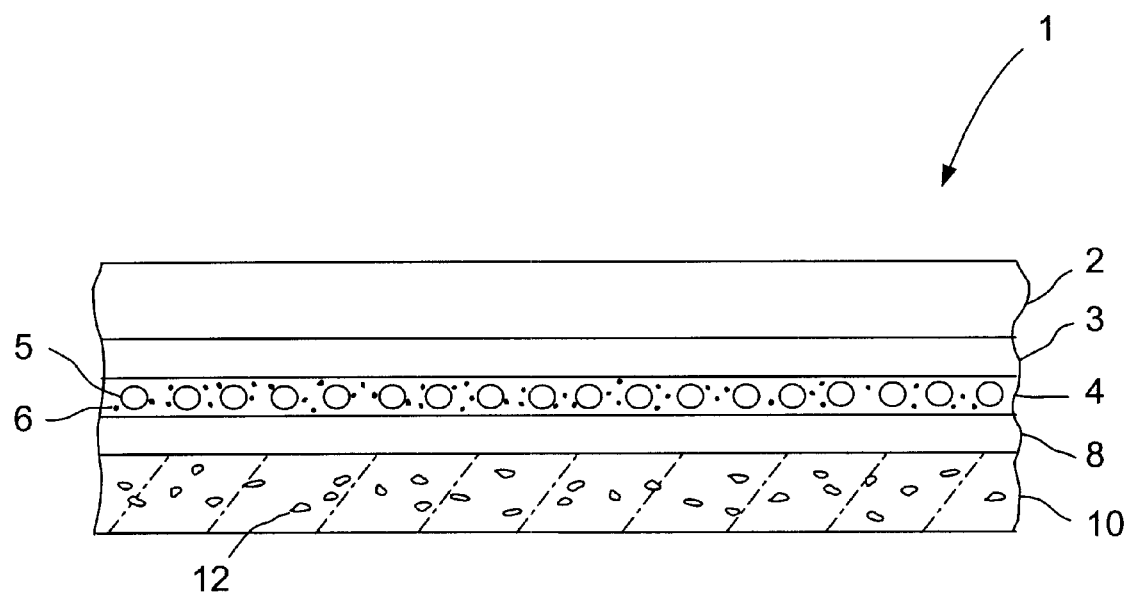
FIG. 1 is a cross-sectional view of a prior-art imaging system.

The present invention is directed to a self-contained imaging assembly for developing and printing an image, which assembly provides improved image quality by reducing the variation in the sensitometric response of the media caused by change in the relative humidity of the environment.

As mentioned above, the self-contained imaging assembly comprises an imaging layer or series of layers in which a color developing material (also referred to as a color developer) reacts with a dye precursor (also referred to as a color former) inside microcapsules. Typically, the microcapsules encapsulate photohardenable compositions comprising a photosensitive initiator and hardenable material that undergoes a change of mechanical strength when irradiated with light of a predetermined wavelength, wherein the plurality of microcapsules encapsulates at least one dye precursor for coloring when brought into contact with the color developing material.

The plurality of microcapsules comprises three different types of microcapsules. The three types of microcapsules encapsulate the polymerization initiator, photocurable resin (each photocuring by irradiation with light of one of the three primary colors of light, respectively), and the colorless dye precursors for producing each of the colors of yellow, magenta and cyan. For example, when irradiating the self-contained imaging assembly with blue light (with a wavelength of about 470 nm), the photocurable resin of the microcapsules containing only yellow dye precursors is photocured, and these microcapsules (yellow) differentially rupture (partially rupture or not rupture at all) during pressure development of the self-contained imaging assembly; however the microcapsules which were not photocured (magenta and cyan) rupture and the magenta and cyan dye precursors are forced out from the microcapsules and react with the color developing material, whereupon coloring occurs, and these colors mix to become a blue color, whereupon this blue color can be seen through the light-transmitting support.

Further, when irradiating the self-contained imaging assembly with green light (with a wavelength of about 525 nm), the photocurable resin of the microcapsules containing only magenta dye precursors is photocured, the yellow and cyan microcapsules are ruptured by pressure development, and as a result of the reaction of the color developing material with the yellow and cyan dye precursors the respective coloring occurs, whereupon these colors mix to become a green color. Moreover, when irradiating the self-contained imaging assembly with red light (with a wavelength of about 650 nm), the photocurable resin of the microcapsules containing only cyan dye precursors is photocured, the yellow and magenta microcapsules are ruptured by pressure development, and as a result of the reaction of the color developing material with the yellow and magenta dye precursors the respective coloring occurs, whereupon these colors mix to become a red color.

Furthermore, when all microcapsules are photocured to maximum hardness by exposure to light corresponding to the three types of microcapsules previously mentioned, they do not rupture even by pressure development. Therefore coloring does not occur, and the surface of the sheet support can be seen through the light-transmitting support, i.e. the sheet support surface color (white in the present embodiment) becomes the background color. In short, a color image is formed only in the areas where a coloring reaction occurred when the microcapsules ruptured. This coloring principal is sometimes called "self-coloring."

A prior-art image assembly is illustrated in FIG. 1 which imaging assembly 1 comprises in order: a first transparent support 2, a subbing layer 3, an imaging layer 4 comprising photohardenable microcapsules 5 and a developer material 6, a layer of adhesive 8, and a second support 10 which may or may not contain an opacifying agent 12. By image-wise exposing this unit to actinic radiation, the microcapsules are differentially hardened in the exposed areas and the exposed unit can then be subjected to pressure to rupture the microcapsules.

Figure 2:
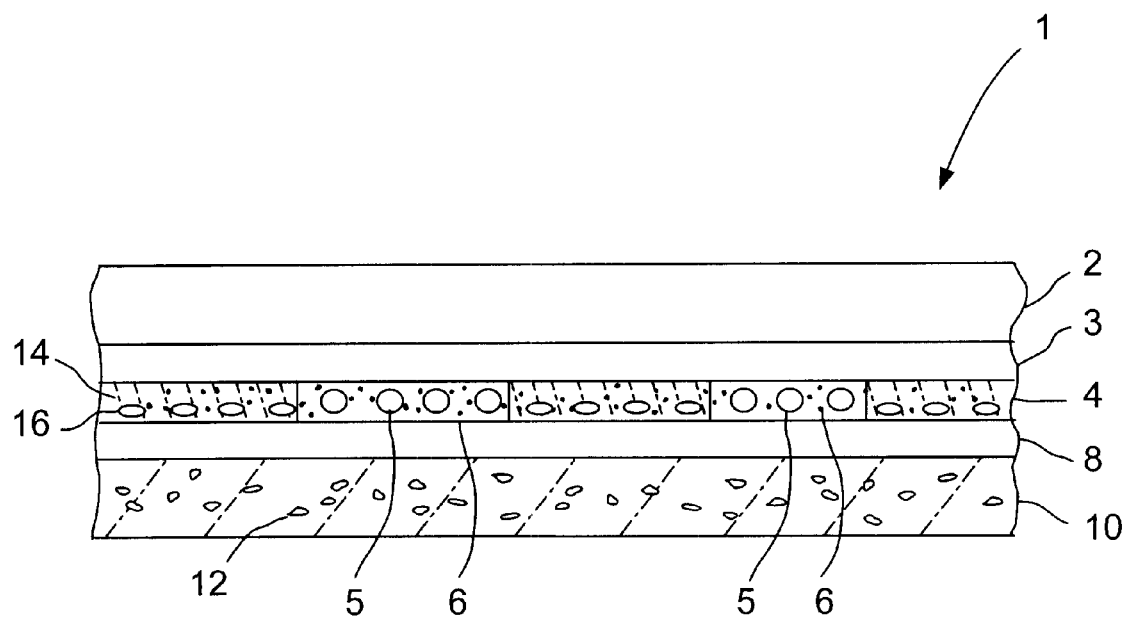
FIG. 2 is a cross-sectional view of the prior-art imaging system of FIG. 1 after exposure and microcapsule rupture.

FIG. 2 illustrates the prior-art imaging assembly of FIG. 1 after exposure and rupture of the microcapsules 5. Ruptured microcapsules 16 release a color forming agent, whereupon the developer material 6 reacts with the color forming agent to form an image 14. The image formed is viewed through the transparent support 2 against the support 10 which can contain a white pigment. Typically, the microcapsules will consist of three sets of microcapsules sensitive respectively to red, green and blue light and containing cyan, magenta and yellow color formers, respectively, as described above and disclosed in U.S. Pat. No. 4,772,541 and U.S. Pat. No. 4,440,846.

Imaging layer 4 typically contains about 20 to 80% (dry weight) developer, about 80 to 20% (dry weight) microcapsules and 0 to 20% of a binder. The layer is typically applied in a dry coat weight of about 8 to 50 g/m$^2$. An example of such a coating formulation is illustrated in Example 1 of U.S. Pat. No. 5,916,727.

The prior art teaches that in the self-contained photohardenable imaging assembly as shown in FIG. 1, the first transparent support 2 through which the image is viewed can be formed from any transparent polymeric film, so long as a film is selected that provides good photographic quality when viewing the image and is preferably resistant to yellowing. The first support 2 is typically a transparent polyethylene terephthalate (PET) or polyvinylchloride as the light-transmitting or transparent support. PET provides a barrier to water vapor transmission to some extent and is transparent. Of course, thicker coatings will provide a greater barrier to vapor transmission but, at some point, thicker layers begin to be disadvantaged by decreasing transparency, processibility, flexibility and the like.

The present invention is directed to a self-contained photohardenable imaging assembly in which an intermediate resilient layer is positioned between at least one support and said imaging layer, which intermediate has a thickness of 10 to 50 microns (preferably 15 to 25 microns) and comprises a relatively resilient material compared to the at least one support, wherein the Young's modulus of the first support is at least 690 MPa (100 kpsi), and the Young's modulus of said intermediate resilient layer is less than 69 MPa (10 kpsi), preferably 0.14 to 69 MPa (0.020 to 10 kpsi) and more preferably 2.8 to 14 MPa (0.4 to 2 kpsi).

According to one embodiment of the invention the Young's modulus of the intermediate resilient layer is 0.1% to 200%, more preferably, from 1% to 100% of the Young's modulus of the imaging layer at 80% relative humidity (and 25° C.).

The intermediate resilient layer may be on the frontside, backside, or both sides of the imaging layer or layers. Preferably, the intermediate resilient layer is on the front side of the imaging assembly, particularly when a pressure roller or pressure stylus is applied to the front side of the imaging assembly for printing.

The intermediate resilient layer can be made from a wide variety of materials that have suitable Young's Modulus and (if on the face side of the imaging assembly) transparency. The intermediate resilient layer may be a synthetic or natural material. Preferably an elastomeric or rubber material is employed, for example, olefin-based rubbers, a rubber derived from butadiene (styrene-butadiene), nitrile rubber, butyl rubber, ethylenepropylene rubber, acrylate rubber, silicone rubber, polyurethane rubber, polybutadiene rubber, fluorocarbon rubber, polysulfide rubber, epichlorohydrin rubber, polyisobutylene rubber and polychloroprene rubber, chlorosulfonated polyethylene, and the like. Other suitable natural and synthetic rubbers, for example, are described in "Rubber Technology", Wemer Hofmann, Hansen Publishers, New York, 1989. Preferably, the mechanical properties of the resilient material is insensitive to humidity changes.

To provide adjustment of Young's modulus in the resilient material employed in the invention, various additives or addenda may be included, for example, inorganic or organic fillers can optionally be added to the intermediate resilient layer.

The desired effect of introducing an intermediate resilient layer in the imaging assembly is to reduce the humidity sensitivity of the imaging assembly. Without the intermediate resilient layer, significant stress (pressure) change is seen on the microcapsules at different humidity levels when the same printing pressure is applied. Such a change in stress is called humidity sensitivity.

To further provide humidity resistance, one or both supports may be selected so that they exhibits a water transmission rate of less than 0.77 g/m$^2$/day (0.05 g/100 in2/day), preferably not more than about 0.47 g/m$^2$/day (0.03 g/100 in$^2$/day). Suitably, the support has a thickness of 5 to 250 microns, preferably 10 to 125 microns and (in the case of a transparent support) a light transmission of at least about 80% at a wavelength of 550 nm, preferably a light transmission of at least 80% at a wavelength from 450 to 800 nm, more preferably a light transmission of at least 90% at 550 nm, most preferably from 450 to 800 nm.

By the term "support," as used herein, is meant the material extending from the outside of the assembly to the intermediate resilient layer or, on a side not having an intermediate resilient layer, extending to the imaging layer.

For purposes of defining the invention herein, the intermediate resilient layer is not considered part of a support, although the intermediate resilient layer in combination with a support may be referred to as a composite film or laminate.

Preferably, at least one support, preferably both supports, comprise at least one barrier layer and the support may be a laminate comprising one or more barrier layers or the support may consist entirely of a barrier layer. By the term "barrier layer" or "barrier material" is meant a material that has a water vapor transmission rate of less than 0.77 g/m$^2$/day (0.05 g/100 in$^2$/day) per 25 micron thickness of the material, as determined by the ASTM F-1249 test. Since the barrier layer is part of a support, the support may have other layers that provide a higher water vapor transmission than the barrier layer, so long as the water vapor transmission rate of the entire "top" support, and preferably both supports, is less than 0.77 g/m$^2$/day (0.05 g/100 in$^2$/day). The support comprising a barrier layer may be referred to as a "barrier support." A separable part of the barrier support containing a barrier layer may be referred to as a "barrier sheet," for example, when referring to a material commercially available for use in the present invention.

The barrier material is preselected to have a combination of properties, including thickness (if too thick, too hazy, if too thin not sufficient support) and optical properties. The barrier material must be highly transparent, colorless, practical and cost effective, manufacturable or commercially available, able to be applied via coating or lamination, and stable (non-yellowing). However, barrier materials are optional.

Thus, one embodiment of the present invention is directed to a self-contained photohardenable imaging assembly packaged for commercial sale wherein the assembly comprises, in order, a first transparent support that is 5 to 250 microns in thickness and has a light transmission of at least about 80% at a wavelength of 550 nm and a water vapor transmission rate of less than 0.77 g/m$^2$/day (0.05 g/100 in$^2$/day); an intermediate resilient layer having a thickness of 10 to 50 microns (preferably 15 to 25 microns) comprising a relatively resilient material compared to the support, preferably wherein the Young's modulus of the said intermediate resilient layer is 0.1% to 200%, more preferably 1% to 100%, of the Young's modulus of the imaging layer at 80% relative humidity; one or more imaging layers comprising a plurality of microcapsules encapsulating a photohardenable composition and a color precursor which can react with a developing material in the same or an adjacent imaging layer; and a second support which may be opaque or transparent that is 5 to 250 microns thick.

In a preferred embodiment of the invention, the assembly is sealed and preconditioned to a relative humidity within the range of about 40 to 90%. The assembly may be sealed by means of heat or other means.

Materials which can be used as a barrier sheet for a transparent support include, but are not limited to, fluorinated polymers, ceramic coated polymers, for example aluminum oxide, indium tin oxide, or silicon nitride coated on polyester or other transparent polymeric substrates, and other sheet materials meeting the above limitations. Especially preferred are $Al_2O_3$ vacuum deposited coatings on a polyester film (for example, Toppan™ GL-AE, available from Toppan Printing Co.) and chlorotrifluoroethylene homopolymer and copolymer films (for example, ACLAR™ films available from Honeywell Corp.).

In one embodiment, the top or first support can be a laminate comprising a polyester layer and a material having a lower water transmission rate, for example a polyester layer covered with a ceramic barrier layer or a halogenated polymeric barrier layer. The polyester layer may be on the outside or inside, or both the inside and the outside, of the barrier layer. Preferred polyester films include, but are not limited to, poly(ethylene terephthalate), poly(1,4-cyclohexanedimethylene terephthalate), poly(ethylene 1,2-diphenoxyethane-4,4'-dicarboxylate), poly(butylene terephthalate), poly(ethylene naphthalate) and the like; and blends or laminates thereof with other polymers. Particularly preferred embodiments are poly(ethylene terephthalate) and poly(ethylene naphthalate). The polymer film can contain an ultraviolet (UV) ray absorber.

Figure 3:
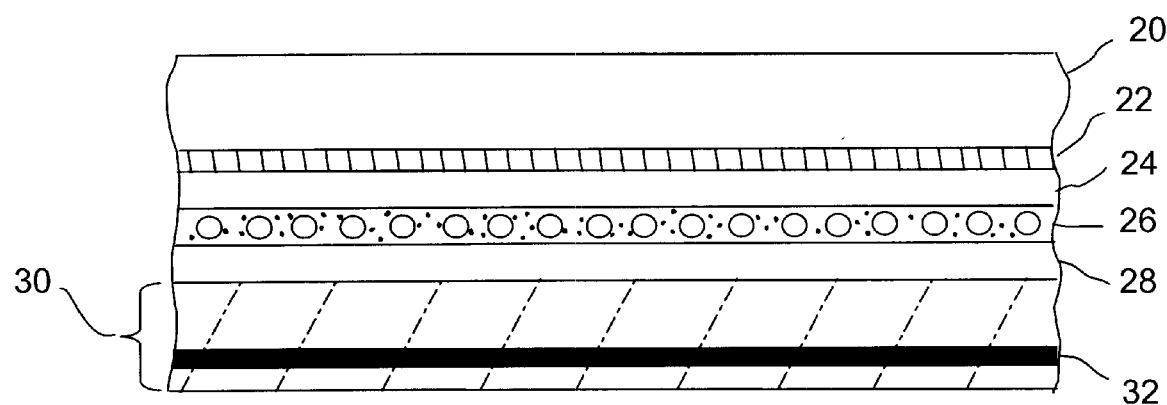
FIG. 3 is a cross-sectional view of one embodiment of an imaging system having an intermediate resilient layer according to the present invention.

FIG. 3 shows a first embodiment of a laminate structure for an imaging assembly according to the present invention, in which there is a support front layer 20, which can be conventional polyester, for example clear polyethylene terephthalate (PET); an intermediate resilient layer 22, and a subbing layer 24. The support front layer 20, intermediate resilient layer 22, and subbing layer 24 form the transparent side to the imaging assembly. Within the imaging layer 22 are seen microcapsules (indicated by ovals) responsive to different hues of light and developer material (indicated by specks). On the opaque side of the assembly is a white support 30 attached to the imaging layer 26 by an adhesive layer 28. A barrier layer, for example, a metal coated polyester is indicated at 32. As will be understood by the skilled artisan other layers may be added or substituted, for example, additional polymeric material supporting materials, barrier layers, or UV absorbing layers.

Figure 4:
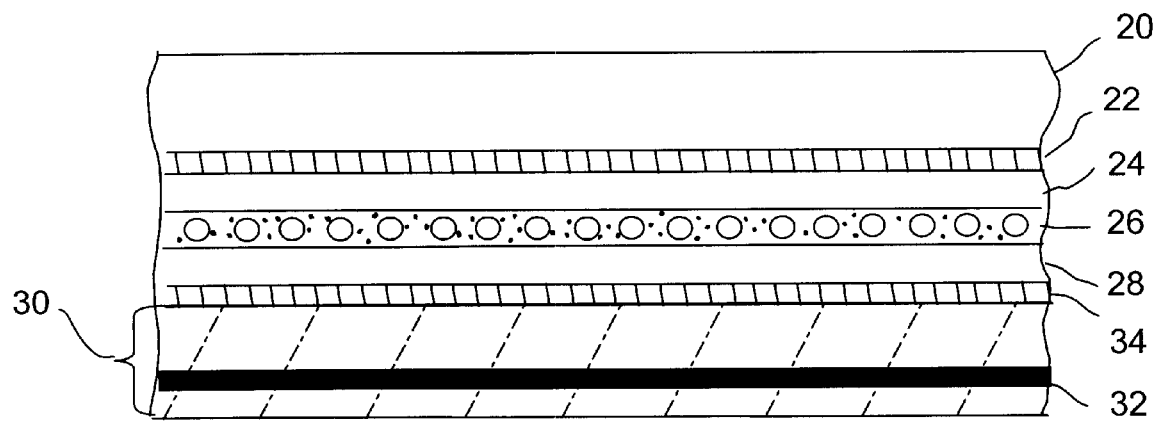
FIG. 4 is a cross-sectional view of a second embodiment of an imaging system according to the invention, in which there are two intermediate resilient layers, positioned between the imaging layer and each support.

FIG. 4 shows a second embodiment of a laminate structure for an imaging assembly according to the present invention, in which there are two intermediate resilient layers, in which there is shown a support front layer 20, which can be conventional polyester, for example clear polyethylene terephthalate (PET); an intermediate resilient layer 22, and a subbing layer 24. The support front layer 20, intermediate resilient layer 22, and subbing layer 24 form the transparent side to the imaging assembly. Within the imaging layer 26 are microcapsules (indicated by ovals) responsive to different hues of light and developer material (indicated by specks). On the opaque side of the assembly is a white support 30 comprising two different materials separated by a barrier layer 32. For example, the layer outside the barrier layer may be a polyester or polyolefin material, and the layer inside the barrier layer may be cellulosic paper or polyester. An intermediate resilient layer 34 is shown attached to the imaging layer 26 by an adhesive layer 28.

The bottom support may be conventional. One common and conventional opaque support, for example, is polyethylene terephthalate (PET) containing an opacifying agent, paper or paper lined with film such as polyethylene, polypropylene, polyester, etc. Opaque films can be composites or admixtures of the polymer and the opacifying agent or pigment in a single layer. Alternatively, the opacifying agent can be provided in a separate layer underlying or overlying a polymer film such as PET. The opacifying agent employed in these materials is an inert, light-reflecting material which exhibits a white opaque background. Materials useful as the opacifying agent include inert, light-scattering white pigments such as titanium dioxide, magnesium carbonate or barium sulfate. In a preferred embodiment the opacifying agent is titanium dioxide. The opaque support, for example, may be a polyethylene terephthalate support containing about 10% titanium dioxide which provides a bright white. Such a support is commercially available from DuPont Co. under the product designation Melinex™.

Preferably, the second support is an opaque barrier support that is 12 to 250 microns in thickness and has a water vapor transmission rate of less than 0.77 g/m$^2$/day (0.05 g/100 in$^2$/day), said second support comprising in order starting from the outside of the assembly: a backing layer, an aluminum metallized barrier layer, a tie (i.e., adhesive) layer, a paper layer, a tie layer, and a biaxially oriented microvoided polyolefin or resin coated pigmented polyolefin layer. The metallic barrier layer may be laminated or coated with a pigmented layer to reduce the metallic color, which may be aesthetically unpleasing or unfamiliar. Suitably, the face side of the opaque support, which is the side closest to the imaging layer, has a light reflectance of greater than 90 percent, preferably greater than 95%.

Another preferred second support is opaque, has a thickness of 12 to 250 microns and water vapor transmission rate of less than 0.77 g/m$^2$/day (0.05 g/100 in$^2$/day), and comprises in order starting from the outside surface of the assembly: a backing layer, an electrically non-conductive barrier layer (which may, for example, be the same barrier material as in the transparent support), a tie layer, a paper layer, a tie layer, and a biaxially oriented microvoided polyolefin or resin coated pigmented polyolefin layer. Again, the face side of the opaque support preferably has a light reflectance of greater than 90 percent, preferably greater than 95%.

The tint of the opaque support may be modified to compensate for the yellowish color typical of phenolic resin developers.

In the event that the second support is transparent, it preferably has a light transmission which is the same as that described above for the first support, which light transmission is at least about 80% at a wavelength of 500 nm. In this case, the same material may be used for both the top and bottom supports. Using the same material for both the top and bottom supports has the advantage of reducing curl of the self-contained assembly. On the other hand, if the second support is opaque, it may be more economical to use a laminate that includes aluminum or other metal foil to achieve the desired low vapor transmission rate of the present invention.

Preferably, both the top and bottom supports are barrier supports. In this case, it is also preferred (but optional) that the peripheral edges of the self-contained assembly are sealed, to prevent water vapor transmission through the side edges, although this is less a concern in view of the small surface area compared to the front and back of the imaging assembly. The edges of the films can be heat sealed together or they can be sealed by any other techniques.

Adhesive materials useful for adhering the second support or back laminate to the emulsion or imaging layer can be selected from the general class of "modified acrylics" that have good adhesion, which may be formulated with improved "tack" by addition of tackifying resins or other chemical additives. A useful adhesive must be designed for high initial adhesion and for adhesion to plastic substrates like polyester. It must have the ability to flow quickly for laminating to porous material (the imaging layer) and yet be inert with respect to the imaging layer. High strength adhesives useful in this invention, for example, are the film label stock adhesives of the 3M Company; including 3M's #300 and #310 adhesive formulas which exhibit "inertness" to the imaging layer. Other examples of adhesives useful in this invention are aqueous-based adhesives such as Aeroset™ 2177 or Aeroset™t 2550, 3240, and 3250 which are commercially available from Ashland Chemical Co., PD 0681, AP 6903, and W 3320 available from H. B. Fuller, or solvent-based pressure sensitive adhesives such as PS 508 sold by Ashland Chemical Co. The adhesives may be used separately or in combination. Preferably, the adhesive is transparent or translucent and most preferably it is a transparent adhesive which remains transparent even after subjecting the assembly to actinic radiation and pressure necessary to image-wise expose and rupture the microcapsules. The amount of the adhesive will vary depending on the nature of the adhesive and the support. The adhesive is generally applied in an amount of about 0.5 to 20 $g/m^2$.

A subbing layer for promoting adhesion between the transparent support or front laminate and the imaging layer must have good compatibility with the imaging layer, must be transparent, must not effect the sensitometric response of the imaging layer, and must be chemically stable. Amorphous polyesters, which may be applied as an aqueous dispersion, have been found to work well as the subbing layer material. Polymers with molecular weights of 5,000–15,000, with a low hydroxyl number and low acid number, can be employed, for example, the AQ polymers from Eastman Chemical Co. and, more particularly, AQ38 and AQ55. The subbing layer is coated onto the transparent support at a dried coating weight of from about 0.1 to about 5.0 $g/m^2$, with a preferred dried coating weight of from about 0.5 to 2.0 $g/m^2$.

Preferably the subbing layer also includes an ultraviolet (UV) ray absorber. Many types of UV absorbing materials have been described in the prior art, including U.S. Pat. Nos. 3,215,530, 3,707,375, 3,705,805, 3,352,681, 3,278,448, 3,253,921, 3,738,837, 4,045,229, 4,790,959, 4,853,471, 4,865,957, and 4,752,298, 5,977,219, 5,538,840 and United Kingdom Patent 1,338,265. Most preferred UV absorbers are polymeric UV absorbers prepared by the method described in U.S. Pat. Nos. 4,496,650, 4,431,726, 4,464,462 and 4,645,735, 5,620,838, EP 0 190 003, U.S. Pat. Nos. 3,761,272, 3,813,255, 4,431,726, 4,455,368, and 4,645,735.

Suitable photohardenable compositions, photoinitiators, chromogenic materials, carrier oils and encapsulation techniques for the layer of microcapsules are disclosed in U.S. Pat. No. 4,440,846; 4,772,541; and 5,230,982. Although the latter photohardenable compositions are non-silver systems, silver-based photohardenable microencapsulated system such as that described in U.S. Pat. Nos. 4,912,011; 5,091,280 and 5,118,590 and other patents assigned to Fuji Photo Film Co are also suitable for use in the present invention.

In accordance with the preferred embodiments of the invention, a full color imaging system is provided in which the microcapsules are sensitive to red, green, and blue light, respectively. The photohardenable composition in at least one and preferably all three sets of microcapsules may be sensitized by a cationic dye-borate anion complex, e.g., a cyanine dye/borate complex as described in U.S. Pat. No. 4,772,541. For optimum color balance, the microcapsules are sensitive (lambda max) at about 450 nm, 540 nm, and 650 mn, respectively. Such a system is useful with visible light sources in direct transmission or reflection imaging. Such a material is useful in making contact prints or projected prints of color photographic slides. They are also useful in electronic imaging using lasers, light emitting diodes, liquid crystal displays or pencil light sources of appropriate wavelengths.

Because cationic dye-borate anion complexes absorb at wavelengths greater than 400 nm, they are colored. The unreacted dye complex present in the microcapsules in the low density image areas can cause undesired coloration in the background area of the final picture, for example, the mixture of microcapsules tends to be green which may give the low density image areas a slight greenish tint. Approaches to reducing undesired coloration in the low density image area as well as the developed image include reducing the amount of photoinitiator used, adjusting the relative amounts of cyan, magenta and yellow microcapsules, or providing a compensating tint in the white opaque support.

The photohardenable compositions used in the microcapsules may also contain a disulfide coinitiator. Examples of useful disulfides are described in U.S. Pat. No. 5,230,982. By means of the optional use of such disulfides, the amount of the photoinitiators used in the microcapsules can be reduced to levels such that the background coloration or residual stain is less than 0.3 and preferably less than 0.25 density units.

The photohardenable compositions of the present invention can be encapsulated in various wall formers using conventional techniques, including coacervation, interfacial polymerization, polymerization of one or more monomers in an oil, as well as various melting, dispersing, and cooling methods. To achieve maximum sensitivities, it is important that an encapsulation technique be used that provides high quality capsules which are responsive to changes in the internal phase viscosity in terms of their ability to rupture. Because the borate tends to be acid sensitive, encapsulation procedures conducted at higher pH (e.g., greater than about 6) are preferred. Melamine-formaldehyde capsules are particularly useful. U.S. Pat. No. 4,962,010 discloses a conventional encapsulation useful in the present invention in which the microcapsules are formed in the presence of pectin and sulfonated polystyrene as system modifiers. A capsule size should be selected which minimizes light attenuation. The mean diameter of the capsules used in this invention typically ranges from approximately 1 to 25 microns. As a general rule, image resolution improves as the capsule size decreases. Technically, however, the capsules can range in size from one or more microns up to the point where they become visible to the human eye.

The developer materials employed in carbonless paper technology are useful in the present invention. Illustrative examples are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts of aromatic carboxylic acids or derivatives thereof such as zinc salicylate, tin salicylate, zinc 2-hydroxy napththoate, zinc 3,5 di-tert butyl salicylate, zinc 3,5-di-(a-methylbenzyl) salicylate., oil soluble metals salts or phenol-formaldehyde novolak resins (e.g., see U.S. Pat. Nos. 3,672,935 and 3,732,120) such as zinc modified oil soluble phenol-formaldehyde resin as disclosed in U.S. Pat. No. 3,732,120, zinc carbonate etc. and mixtures thereof. The particle size of the developer material can affect the quality of the image. In one embodiment, the developer particles are selected to be in the range of about 0.2 to 3 microns, preferably in the range of about 0.5 to 1.5 microns. One or more suitable binders selected from polyethylene oxide, polyvinyl alcohol, polyacrylamide, acrylic latices, neoprene emulsions, polystyrene emulsions, and nitrile emulsions, etc. may be mixed with the developer and the microcapsules, typically in an amount of about 1 to 8% by weight, to prepare a coating composition. A preferred developer material is one which provides good compatibility with the microcapsule slurry solution, for example Schenectady International resin HRJ-4250 solution.

The self-contained imaging assembly used as photosensitive recording medium is not limited to the embodiments that have been described before, but different variations or modifications thereof are possible. For example, instead of encapsulating the photocurable resin and the polymerization initiator inside the microcapsules of the self-contained imaging assembly, the photocurable resin and the polymerization initiator can also be included in the material constituting the microcapsules. Further, instead of photocurable microcapsules, the self-contained imaging assembly can contain photo-softening microcapsules, for example, microcapsules which have sufficient strength in the unexposed state, and which soften when exposed to light of a predetermined wavelength. In this case it is desirable to perform thermal-curing by heat-fixing.

It is not necessary to use red, green and blue light to capture the image in the imaging layer. Depending on the characteristics of the photosensitive recording medium, light with various wavelengths can be selected. For example, light emitting elements producing infrared light, red, and green, or light emitting elements producing far infrared light, near infrared light, and red can also be selected. Ultraviolet and far ultraviolet are also advantageous examples of valid color choices for light emitting elements. Moreover, the number of colors of the light emitting elements is not limited to the three colors red, green, and blue; it is equally possible to use only one or two colors, or to select four colors, as in a typical color printer using yellow, magenta, cyan, and black, or even more colors. Furthermore, the choice of light emitting elements includes, but is not limited to LEDs, electroluminescent lamps (EL), light emitting plasma and laser devices, and other light emitting elements.

The manufacture of an assembly according to the present invention can be exemplified as follows. A clear side of the assembly, can be manufactured by lamination of at least two separate materials, including a clear front support, which can include a barrier sheet such as a ceramic-coated polyester, an intermediate resilient layer, and other optional layers. A UV absorbing subbing bottom layer may be included. The intermediate resilient layer may be coextruded with other layers on the transparent side of the assembly or, alternatively, the intermediate resilient layer may be coated or laminated onto another layer in the transparent composite film. At the same time as the submanufacture of the transparent composite film or sheet, an opaque support can be manufactured by lamination of a plurality of separate materials, for example, a polyolefinic material, paper stock, and an aluminum coated barrier sheet. These materials are formed into an opaque support with the addition of a backing/matte sheet. An emulsion or image layer can then applied to the clear support to form the first of two final components of the assembly. This emulsion-containing component can then be combined with the opaque support to form a final laminate which can then be cut and edge sealed, followed by packaging and bar coding.

In order to insure that the imaging system is effectively sealed between the supports, a subbing layer is provided to attach the transparent front composite film or laminate to the imaging layer and an adhesive is provided between the back composite film or laminate and the imaging layer. For optical clarity, the subbing layer will typically be located between the front laminate and the imaging layer. However, which composite film receives the subbing layer and which laminate or composite film receives the adhesive is a function of which composite film is coated with the wet imaging layer composition and which is assembled with the coated and dried imaging layer. The composite laminate which is coated with the imaging layer composition (which is typically the front laminate) will be provided with the subbing layer and the support which is assembled will receive the adhesive. In accordance with the preferred embodiment of the invention, the subbing layer is formed from a compound having chemical moieties such as hydroxy groups which will react with and bind to the microcapsules.

The imaging assembly of the present invention can be exposed in any suitable cameras or other exposure devices to provide an image. The imaging assembly of this invention is especially suitable for exposure using a liquid crystal array or light emitting diodes driven by a computer generated signal or a video signal for the reproduction of images from a video cassette recorder, a camcorder, or the like. It is possible to utilize, for example, with the current state of technology, a very economical compact printer, weighing under 500 g and having a size less than 100,000 $mm^3$ that prints directly from a digital camera utilizing a Compact-Flash™ card interface and provides a resolution of 150 ppi or more with continuous tone and over 250 gradation levels.

The print is "developed," based on the "latent image" formed by the selectively photohardened microencapsulated color formers, by the application of pressure or by the application of both heat and pressure. See, for example, the image forming device described in U.S. Pat. No. 5,884,114 to Iwasaki, in which a photo and pressure sensitive printer provides the feeding and discharging of a photosensitive imaging medium at the front of the printer housing, which device can have the added advantage of being easily integrated into other equipment such as a personal computer. In this particular device, the latent image is formed by a movement in the main scanning direction of an LED-type exposure head. Thereafter, an upper nip roller of a developing mechanism is moved from a separated position to a pressing position. The capsules that have not been photohardened are ruptured by pressure and a full color image is formed on the sheet, heat-fixing (which is optional to the present invention) is performed by a film heater, and the imaged assembly is discharged from the front of the housing for the device or printer.

A typical pressure-type image-forming device (which can be referred to as a printer) typically comprises a printer housing with a lightproof cartridge for accommodating photosensitive imaging media (alternately referred to as recording media) mounted to the front of the printer housing so as to be easily detachable. In some devices, a preheater is employed for preheating the photosensitive imaging medium. A typical exposure mechanism may include an exposure head for exposing while scanning in a direction perpendicular to the surface of the drawing and a developing mechanism for pressure development by means of a pair of an upper and a lower nip roller. The roller may be maintained under pressure by a spring. An optional fixing heater for heat-fixing the developed photosensitive imaging medium may be used. A discharge tray may be provided at the rear end of the printer housing. The pressure sensitive printer may be designed so that sheets are both fed and discharged at the front side of the printer housing.

An image forming device for treatment of the imaging media can, for example, comprise exposure means for forming a latent image on the imaging medium upon exposure based on image information, developing means for developing the latent image by means of the coloring material coming out of the microcapsules when pressure is applied to the photosensitive imaging medium on which the latent image was formed by the exposure means, wherein the developing means comprise a pair of an upper and a lower nip roller facing each other and sandwiching the transport path of the photosensitive imaging medium, pressing means for pressing one nip roller against the other nip roller, roller switching means for alternately switching between a pressing position in which the one nip roller is brought into pressure contact with the other nip roller and a separated position in which the one nip roller is separated from the other nip roller, and a transport path for transporting the photosensitive imaging medium comprises a feed path for feeding the photosensitive imaging medium on the inlet side, a discharge path for discharging the recorded photosensitive imaging medium.

In one embodiment, the developing mechanism may comprise a pair of an upper and a lower nip roller, a rectangular frame fixed inside the printer housing for supporting the nip rollers, a pair of compression springs for pressing both ends of the roller axis of the upper nip roller toward the lower nip roller, and a roller switching mechanism for alternately switching between a pressing position in which the upper nip roller is brought into pressure contact with the lower nip roller and a separated position in which it is separated from the lower nip roller. If the pressing force of each of the springs is 150 kgf, the upper nip roller presses with a total force of 300 kgf on the lower nip roller. However, other means for applying pressure can be employed, for example, a pressure stylus.

A control unit for the image-forming device may comprise a CPU, a ROM and a RAM, an I/O interface, and drive circuits, wherein a stepping motor for paper transport, a solenoid actuator for driving a switching plate, a film heater, a motor for roller switching, a stepping motor for driving the carriage, the exposure head, etc., are respectively connected to the drive circuits. A connector and a control panel may also be connected to the control unit. In one embodiment, image data (RGB image data) from an external host computer may be fed via a connector to the control unit.

The ROM can store control programs for controlling all operations of the printer, a control program for calculating, from the input image data, the duration for which each LED of the exposure head is turned on and the timing thereof, a control program for controlling the transport of the self-contained imaging assembly by controlling the stepping motor for sheet transport synchronously with the exposure to green, red and blue light, a control program for controlling the scanning of the exposure head by controlling the stepping motor for driving the carriage synchronously with the exposure to green, red and blue light, etc. The different buffers and memory types necessary for running the control programs are in the RAM. The number of copies to be printed, the enlargement or reduction ratio of the image, the size of the image forming area of the imaging assembly, etc., input by an operator at the control panel, can be stored in the memory of the RAM. Exposure can take place upon calculation of the driving conditions for the stepping motor.

In one type of image-forming device, when image data of an image is sent to the control unit, the image data is divided into R image data, G image data, and B image data and stored in a buffer of the RAM. Each LED of an exposure heat can be electrically driven by a drive circuit via a cable.

In one embodiment of practicing the invention, imaging medium sheets may be packaged as a stack of sheets which go into the printer. The individual sheets may be picked from the stack of sheets and transported into the "printing path" of the printer. However, if two or more sheets at the same time are picked up and fed into the printing path the printer, the printer may become jammed, requiring disassembly by the user. To avoid this problem, the static in the sheets may be reduced or eliminated just prior to the final packaging; and a precision hinge on the printer film cassette or tray may be used. Also, a method to further aid the feeding of sheets into the printer is to add a "back coat" or backing layer to the imaging medium. This is preferably coated on the outer surface of the bottom or second support (which has the adhesive on the opposite side), typically the white support layer. This backing layer material may be formulated to have some perceived aesthetic value (such as a writable or printable coating), but must have some difference relative to the adjacent next sheet surface which causes these surfaces not to adhere together. The preferred back coat material has a slight roughness to aid the "printer pickup roller" initiating the sheet movement into the printer, for example, a Sheffield Smoothness of 150–180 Sheffield units, such as a standard face matte coating on 3M label stock material. Other commercially available or known matte coatings can also be used. In general, these coatings may include a binder and a grit or abrasive such as silica. Preferably, the front side of the first support and the back side of the second support has a coefficient of friction of less than 0.4.

The present invention is illustrated in more detail by the following non-limiting example.

EXAMPLE 1

This example illustrates the effect of an intermediate resilient layer in reducing the humidity sensitivity of an imaging assembly, as determined by finite element analysis. In accordance with conventional finite element analysis techniques, the first step is to generate a geometric representation of the entire imaging assembly including all layers divided into discrete elements (also called mesh). A print head (pressure roller) is also represented as a rigid surface, which moves to the right as it rotates clockwise around its center. The maximum (Tresca) stress in the imaging layer is a critical quantity since it determines whether the microcapsules are going to fracture. The software used is called ABAQUS™ which is commercially available from Hibbitt, Karlsson & Sorensen, Inc. (Pawtucket, R.I.). This software gives stress contours indicating the magnitude and location of the maximum stress.

Without the intermediate resilient layer, significant stress (pressure) change is seen on the microcapsule at different humidity levels. Such a change in stress is called humidity sensitivity. When the relative humidity decreases from 40% to 80%, the Young's modulus of the imaging layer decreases causing the maximum (Tresca) stress in the imaging layer to change from 3.48634 MPa (506 psi) to 2.756 MPa (400 psi). The difference of the stress in the imaging layer due to the humidity change in this case is 0.73034 MPa (106 psi). When the intermediate resilient layer is introduced, however, the maximum stress difference is greatly reduced. For instance, if an intermediate resilient layer with the Young's modulus at 3.15% of that of the imaging layer is used the maximum stress in the imaging layer changes from 2.07389 MPa to 1.94298 MPa. The difference of stress in the imaging layer due to the humidity change in this case is only 0.13 MPa as compared to 0.73034 MPa for the imaging assembly without an intermediate resilient layer. When the printing pressure is adjusted so that the maximum stress at 40% RH still reaches 2.756 MPa to ensure microcapsule rupture, the maximum stress in the imaging layer becomes 2.94203 MPa and 2.756 MPa, respectively, which yields a difference of stress in the imaging layer due to the humidity change 0.18603 MPa.

The relative reduction of the humidity sensitivity in the imaging layer η, is defined as $$\eta = (\Delta\sigma_{no\_intlyer} - \Delta\sigma)/\Delta\sigma_{no\_intlyer} \times 100\% \quad (1)$$

where Δσ denotes the maximum stress difference in the imaging layer at the high and low humidity (e.g., 80% RH and 40% RH, respectively), i.e., $\Delta\sigma = \sigma_{40\%RH} - \sigma_{80\%RH}$. The quantity $\Delta\sigma_{no\_intlyer}$ denotes the maximum stress difference in the imaging layer without the intermediate resilient layer, i.e., $\Delta\sigma_{no\_intlyer} = \sigma_{40\%RH}$ (without intermediate resilient layer) $-\sigma_{80\%RH}$ (without intermediate resilient layer) = 3.48634 MPa − 2.756 MPa = 0.73034 MPa . Therefore, η represents the improvement in percent in regard to the reduction of the humidity sensitivity of the imaging assembly compared to when no intermediate resilient layer is present, and η equals zero for an imaging assembly without an intermediate resilient layer.

When Equation (1) is applied to the imaging assembly comprising an intermediate resilient layer with a Young's modulus at 3.15% of that of the imaging layer, $$\eta = [\Delta\sigma_{no\_intyler} - \Delta\sigma]/\Delta\sigma_{no\_intyler} \times 100\%$$
$$= [0.73034 - 0.18603]/0.73034 \times 100\%$$
$$= 74.5\%$$

This indicates that a 74.5 percent reduction in humidity sensitivity is achieved by introducing an intermediate resilient layer 25 μm thick and with a Young's modulus at 3.15% of that of the imaging layer.

Figure 5:
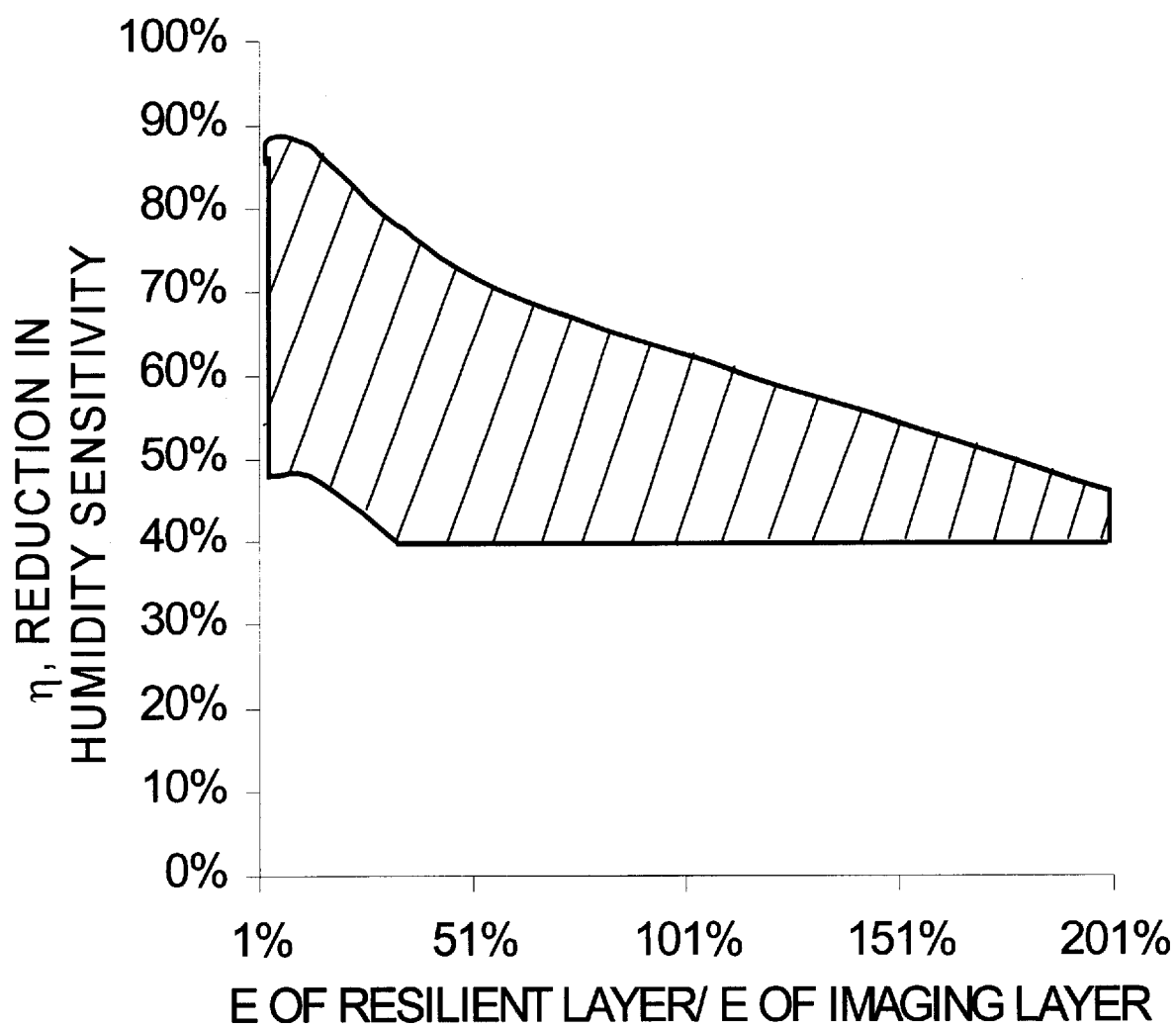
FIG. 5 shows, based on the results of Example 1, the reduction in humidity sensitivity to humidity by the use of an intermediate resilient layer according to the present invention.

Referring now to FIG. 5, the shaded area defines the domain within which a 40 percent or more reduction in humidity sensitivity, η, can be achieved, which is preferred. The horizontal axis is the ratio of the stiffness (Young's modulus) of the intermediate resilient layer to the stiffness of the imaging layer. The vertical axis is the humidity sensitivity reduction in the imaging layer computed using Equation (1).

Figure 6:
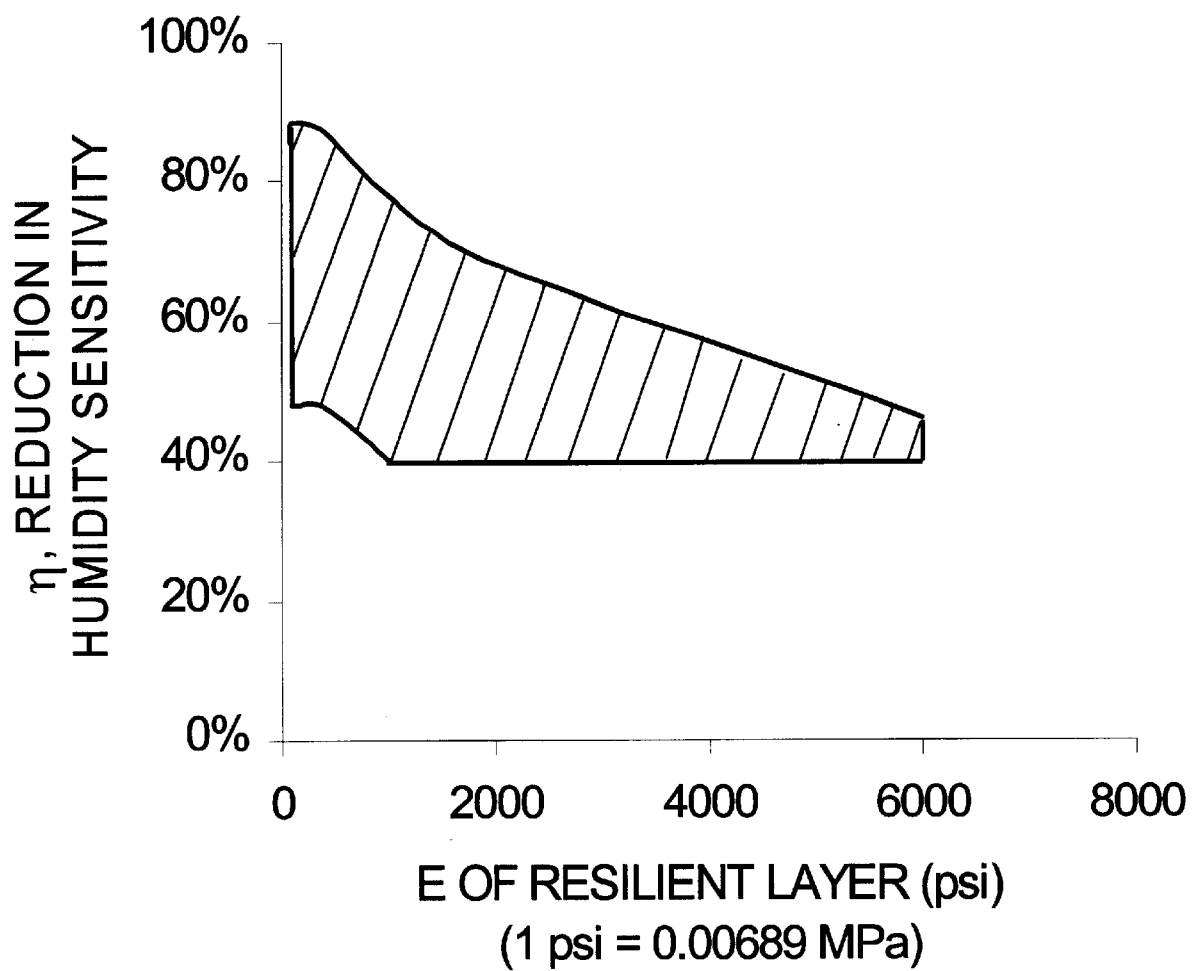
FIG. 6 shows, based on the results of Example 1, the reduction in humidity sensitivity to humidity as a function of Young's Modulus ratio between the intermediate resilient layer and the imaging layer.

Referring now to FIG. 6, the shaded area defines the domain within which a 40 percent or more reduction in humidity sensitivity, η, can be achieved, which is preferred. The horizontal axis is the stiffness (Young's modulus) of the intermediate resilient layer. The vertical axis is the humidity sensitivity reduction in the imaging layer computed using Equation (1).

Table 1 shows the reduction in humidity sensitivity according to the measurement η, which is the maximum stress sensitivity reduction at two different humidity levels defined in Equation (1), compared to an assembly without an intermediate resilient layer (comparative sample A). The comparative samples B and C have intermediate resilient layers with thickness and stiffness combinations that produce a humidity sensitivity reduction less than the 40% reduction provided by the imaging assemblies of the invention. Examples 1 to 7 represent imaging assemblies containing an intermediate resilient layer of the invention and yield a humidity sensitivity reduction more than 40% in comparison to the comparative sample A. As shown in Table 1, the humidity sensitivity reduction increases nonlinearly with respect to the ratio of stiffness of the intermediate resilient layer to the imaging layer for a fixed intermediate resilient layer thickness. For a fixed stiffness, a thicker resilient layer yields a larger reduction in the humidity sensitivity of the imaging layer.

TABLE 1

| Example | Resilient Layer Thickness | Resilient layer Material | E of Resilient Layer/E of Emulsion | Reduction, η* |
|---|---|---|---|---|
| Comparative Sample A (no resilient layer) | 0 | N/A | N/A | 0% |
| Comparative Sample B | 5 μm | Polyurethanes | 4.06% | 30% |
| Comparative Sample C | 5 μm | Silicon rubber | 1.669% | 28% |
| Example 1 | 10 μm | Styenebutadiene rubber | 2.9% | 47% |
| Example 2 | 25 μm | Butyl rubber | 3.48% | 74% |
| Example 3 | 50 μm | Styenebutadiene rubber | 2.9% | 88% |
| Example 4 | 25 μm | Ethenepropene rubber | 4.35% | 74% |
| Example 5 | 25 μm | Polyacrylate rubber | 4.64% | 74% |
| Example 6 | 25 μm | Silicon rubber | 1.669% | 71% |
| Example 7 | 50 μm | Polyurethanes | 4.06% | 88% |

*η is the reduction in humidity sensitivity defined in Equation (1)

Having described the invention in detail and by reference to preferred embodiments thereof, it will be apparent that modifications and variations are possible without departing from the scope of the invention defined in the appended claims.

What is claimed is:

1. A self-contained photohardenable imaging assembly comprising:
    a transparent first support that has a Young's modulus of at least 690 MPa and that is not an adhesive;
    at least one imaging layer comprising a plurality of photohardenable microcapsules encapsulating a color precursor which can react with a developer material in the same or an adjacent imaging layer;
    a second support on the opposite side of 'said imaging layer from said first support, wherein the second support is opaque;
    wherein an intermediate resilient layer is positioned between said transparent first support and all imaging layers that are present, which intermediate resilient layer has a thickness of 15 to 25 microns and a Young's modulus of less than 69 MPa.

2. The imaging assembly of claim 1 wherein the intermediate resilient layer has a Young's modulus from 1% to 200% of the Young's modulus of the imaging layer at 80% RH.

3. The imaging assembly of claim 1 wherein the intermediate resilient layer is a synthetic or natural rubber or elastomer.

4. The imaging assembly of claim 1 wherein the intermediate resilient layer is a synthetic rubber selected from the group consisting of butyl rubber, styrenebutadiene rubber, ethenepropene tubber, acrylate rubber, silicon rubber, polyurethane rubber, polybutadiene rubber, fluorocarbon rubber, polysulfide rubber, epichlorohydrin rubber, polyisobutylene rubber and polychloroprene rubber.

5. The imaging assembly of claim 1 wherein the intermediate resilient layer is coextruded with one or more layers of a support.

6. The imaging assembly of claim 1 wherein the intermediate resilient layer is coated or laminated onto a layer in a support.

7. The imaging assembly of claim 1 wherein the intermediate resilient layer has a light transmission of at least about 80% at a wavelength at 550 nm.

8. The imaging assembly of claim 1 wherein one or both supports is 5 to 250 microns thick and has a water vapor trasmission rate of less than 0.77 g/m²/day, (0.05 g/100 in²/day).

9. The imaging assembly of claim 1 wherein at least one subbing layer is disposed between said first support and said at least one imaging layer.

10. The imaging assembly of claim 1 wherein an adhesive layer is disposed between the imaging layer and the adjacent layer.

11. The imaging assembly of claim 1 wherein the front side of the first support and the back side of the second support has a coefficient of friction of less than 0.4.

12. The assembly of claim 1 wherein the imaging assembly is sealed between the first support and the second support.

13. The imaging assembly of claim 1, wherein the second support comprises an opaque polyethylene terephthalate film containing a white pigment.

14. The assembly of claim 13 wherein said pigment is titanium dioxide.

15. The imaging assembly of claim 1 wherein said first support comprises a clear polyethylene terephthalate film.

16. The imaging assembly of claim 1 wherein said microcapsules are melamine-formaldehyde microcapsules and said developer is a phenolic resin.

17. The imaging assembly of claim 1, the second support further comprising a backing layer, which improves the feedability of said imaging assembly in a printer.

18. The imaging assembly of claim 1 wherein the intermediate resilient layer has a Young's modulus of 2.8 to 14 MPa.

19. A self-contained photohardenable imaging assembly comprising:

a transparent first support that has a Young's modulus of at least 690 MPa and that is not adhesive;

at least one imaging layer comprising a plurality of photohardenable microcapsules encapsulating a color precursor which can react with a developer material in the same or an adjacent imaging layer;

a second support on the opposite side of said imaging layer from said first support, wherein the second support is opaque;

wherein an intermediate resilient layer is positioned between said transparent first support and all imaging layers that are present, which intermediate resilient layer has a thickness of 15 to 25 microns and a Young's modulus of less than 69 MPa, wherein the intermediate resilient layer is a synthetic rubber selected from the group consisting of butyl rubber, ethenepropene rubber, acrylate rubber, silicon rubber, polyurethane rubber, polybutadiene rubber, fluorocarbon rubber, polysulfide rubber, epichlorohydrin rubber, polyisobutylene rubber and polychloroprene rubber, and wherein the support and intermediate resilient layer in combination have light transmission of at least about 80% at a wavelength at 550 nm.

20. The imaging assembly of claim 19 wherein the intermediate resilient layer-has a Young's modulus of 2.8 to 14 MPa.

21. A self-contained photohardenable imaging assembly comprising:

a transparent first support that has a Young's modulus of at least 690 MPa and that is not adhesive;

at least one imaging layer comprising a plurality of photohardenable microcapsules encapsulating a color precursor which can react with a developer material in the same or an adjacent imaging layer;

a second support on the opposite side of said imaging layer from said first support, wherein the second support is opaque;

wherein an intermediate resilient layer is positioned between said transparent first support and all imaging layers that are present, which intermediate resilient layer has a thickness of 15 to 25 microns and a Young's modulus of less than 69 MPa, wherein one or both supports is 5 to 250 microns thick and has a water vapor transmission rate of less than 0.77 g/m²/day (0.05 g/l 00 in²/day), and wherein the support and intermediate resilient layer in combination have light transmission of at least about 80% at a wavelength at 550 nm.

22. The imaging assembly of claim 21 wherein the intermediate resilient layer has a Young's modulus of 2.8 to 14 MPa.

* * * * *